(12) United States Patent
White

(10) Patent No.: US 11,569,205 B2
(45) Date of Patent: Jan. 31, 2023

(54) REDUCING LOSS IN STACKED QUANTUM DEVICES

(71) Applicant: Google LLC, Mountain View, CA (US)

(72) Inventor: Theodore Charles White, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/228,393

(22) Filed: Apr. 12, 2021

(65) Prior Publication Data

US 2021/0233896 A1    Jul. 29, 2021

Related U.S. Application Data

(62) Division of application No. 16/333,020, filed as application No. PCT/US2016/051510 on Sep. 13, 2016, now Pat. No. 10,978,425.

(51) Int. Cl.
*H01L 21/02* (2006.01)
*H01L 25/065* (2006.01)
(Continued)

(52) U.S. Cl.
CPC ......... *H01L 25/0657* (2013.01); *G06N 10/00* (2019.01); *H01L 23/481* (2013.01);
(Continued)

(58) Field of Classification Search
CPC ..... H01L 27/18; H01L 39/223; H01L 39/025; H01L 24/13; H01L 39/045; H01L 24/16;
(Continued)

(56) References Cited

U.S. PATENT DOCUMENTS 7,075,171 B2    7/2006    Tsunehiro
7,932,515 B2    4/2011    Bunyk
(Continued)

FOREIGN PATENT DOCUMENTS

EP    3391415       8/2019
JP    H08-504541    5/1996
(Continued)

OTHER PUBLICATIONS

CA Office Action in Canadian Appln. No. 3036054, dated Apr. 17, 2020, 4 pages.
(Continued)

*Primary Examiner* — Samuel Park
(74) *Attorney, Agent, or Firm* — Fish & Richardson P.C.

(57) ABSTRACT

A device includes: a first chip including a qubit; and a second chip bonded to the first chip, the second chip including a substrate including first and second opposing surfaces, the first surface facing the first chip, wherein the second chip includes a single layer of superconductor material on the first surface of the substrate, the single layer of superconductor material including a first circuit element. The second chip further includes a second layer on the second surface of the substrate, the second layer including a second circuit element. The second chip further includes a through connector that extends from the first surface of the substrate to the second surface of the substrate and electrically connects a portion of the single layer of superconducting material to the second circuit element.

12 Claims, 3 Drawing Sheets

(51) Int. Cl.
    *G06N 10/00* (2022.01)
    *H01L 27/18* (2006.01)
    *H01L 23/48* (2006.01)
    *H01L 23/532* (2006.01)
    *H01L 23/66* (2006.01)
    *H01L 23/00* (2006.01)
    *H01L 25/00* (2006.01)
    *H01P 7/08* (2006.01)

(52) U.S. Cl.
    CPC .. *H01L 23/53228* (2013.01); *H01L 23/53257* (2013.01); *H01L 23/53285* (2013.01); *H01L 23/66* (2013.01); *H01L 24/05* (2013.01); *H01L 24/13* (2013.01); *H01L 25/50* (2013.01); *H01L 27/18* (2013.01); *H01P 7/086* (2013.01); *H01L 2223/6611* (2013.01); *H01L 2223/6616* (2013.01); *H01L 2223/6627* (2013.01); *H01L 2224/0401* (2013.01); *H01L 2224/04042* (2013.01); *H01L 2224/05124* (2013.01); *H01L 2224/05166* (2013.01); *H01L 2224/05179* (2013.01); *H01L 2224/13109* (2013.01); *H01L 2224/13116* (2013.01); *H01L 2224/13144* (2013.01); *H01L 2224/13164* (2013.01); *H01L 2224/13179* (2013.01); *H01L 2224/13183* (2013.01); *H01L 2224/81409* (2013.01); *H01L 2225/06513* (2013.01); *H01L 2225/06541* (2013.01); *H01L 2924/04941* (2013.01)

(58) Field of Classification Search
    CPC ..... H01L 25/0657; H01L 25/50; H01L 24/05; H01L 23/66; H01L 23/53285; H01L 23/53257; H01L 23/53228; H01L 23/481; H01L 2224/81409; H01L 2924/04941; H01L 2224/13183; H01L 2224/13179; H01L 2224/13164; H01L 2224/13144; H01L 2224/13116; H01L 2224/13109; H01L 2224/05179; H01L 2224/05166; H01L 2224/05124; H01L 2224/04042; H01L 2224/0401; H01L 2223/6627; H01L 2223/6616; H01L 2223/6611; H01L 2225/06541; H01L 2225/06513; H01L 24/14; H01L 24/81; H01L 25/065; H01L 2924/00014; H01L 2224/131; H01L 29/66977; H01L 2924/00; H01L 29/423; H01L 29/7613; H01L 39/2493; H01L 29/127; H01L 29/66984; H01P 7/086; G06N 10/00
See application file for complete search history.

(56) References Cited

U.S. PATENT DOCUMENTS

| | | |
|---|---|---|
| 9,836,699 B1 | 12/2017 | Rigetti et al. |
| 2003/0111661 A1 | 6/2003 | Ladizinsky et al. |
| 2005/0029512 A1 | 2/2005 | Hato et al. |
| 2005/0035368 A1 | 2/2005 | Bunyk |
| 2010/0026447 A1 | 2/2010 | Keefe |
| 2011/0089405 A1 | 4/2011 | Ladizinsky et al. |
| 2015/0119252 A1 | 4/2015 | Ladizinsky et al. |
| 2017/0133336 A1 | 5/2017 | Oliver |
| 2018/0013052 A1* | 1/2018 | Oliver .................. G06N 10/00 |
| 2018/0247974 A1 | 8/2018 | Oliver |
| 2019/0131511 A1 | 5/2019 | Clarke |

FOREIGN PATENT DOCUMENTS

| | | |
|---|---|---|
| JP | H09-252026 | 9/1997 |
| JP | 2001345488 | 12/2001 |
| JP | 2013-526015 | 6/2013 |
| JP | 2015-506110 | 2/2015 |
| KR | 1020140123498 | 10/2014 |
| WO | WO 94/14201 | 6/1994 |
| WO | WO 2011/126831 | 10/2011 |
| WO | WO 2013/137959 | 9/2013 |
| WO | WO 2014/163728 | 10/2014 |
| WO | WO-2016118210 A2 * | 7/2016 ......... H01L 23/3736 |

OTHER PUBLICATIONS

EP Office Action in European Appln. No. 16775387.0, dated Oct. 1, 2020, 5 pages.

JP Office Action in Japanese Appln. No. 2019-513 972, dated Jun. 8, 2020, 9 pages (with English translation).

KR Allowance of Patent in Korean Appln. No. 10-2019-7010613, dated Feb. 1, 2021, 3 pages (with English translation).

PCT International Preliminary Report on Patentability in International Application No. PCT/US2016/051510, dated Sep. 12, 2016, 10 pages.

PCT International Search Report and Written Opinion in International Application No. PCT/US2016/051510, dated Jul. 25, 2017, 19 pages.

Yorozu et al., "Sub-Kelvin flux quantum control circuits and multi-chip packaging for supporting superconducting qubit," Journal of Physics: Conference Series, 2006, 43(1):1417-1420.

KR Office Action in Korean Appln. No. 10-2019-7010613, dated Aug. 29, 2020, 11 pages (with English translation).

Extended European Search Report in European Appln. No. 22164248.1, dated Sep. 29, 2022, 9 pages.

Office Action in Canadian Appln. No. 3,127,307, dated Oct. 7, 2022, 4 pages.

Office Action in Chinese Appln. No. 201680089250.4, dated Oct. 12, 2022, 26 pages (with English translation).

* cited by examiner

REDUCING LOSS IN STACKED QUANTUM DEVICES

CROSS-REFERENCE TO RELATED APPLICATIONS

This application is a divisional of U.S. Ser. No. 16/333,020, filed Mar. 13, 2019, which is a National Stage Application under 35 U.S.C. § 371 and claims the benefit of International Application No. PCT/US2016/051510, filed Sep. 13, 2016. The disclosure of the foregoing applications are hereby incorporated by reference in their entirety.

TECHNICAL FIELD

The present disclosure relates to reducing loss in stacked quantum devices,

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle+\beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in some aspects, the subject matter of the present disclosure can be embodied in a device including: a first chip including a qubit; and a second chip bonded to the first chip, the second chip including a substrate including first and second opposing surfaces, the first surface facing the first chip, wherein the second chip includes a single layer of superconductor material on the first surface of the substrate, the single layer of superconductor material including a first circuit element. The second chip further includes a second layer on the second surface of the substrate, the second layer including a second circuit element. The second chip further includes a through connector that extends from the first surface of the substrate to the second surface of the substrate and electrically connects a portion of the single layer of superconducting material to the second circuit element.

Implementations of the device can include one or more of the following features or other features described herein. For example, in some implementations, the device includes a bump bond between the first chip and the first layer of the second chip, in which the bump bond is arranged to couple data between the qubit on the first chip and the first circuit element. The bump bond may include indium.

In some implementations, there are no dielectric materials (e.g., no solid dielectric materials) in direct contact with the first surface of the substrate or in direct contact with a surface of the single layer of superconductor material.

In some implementations, the first circuit element includes a resonator.

In some implementations, the single layer of superconductor material includes a wire bond pad. The single layer of superconductor material may also include a transmission line, in which the wire bond pad is electrically connected to the transmission line and the transmission line is arranged to electromagnetically couple or electrically couple to the first circuit element.

In some implementations, the through connector extends through an opening in the substrate. In some implementations, the second layer includes a dielectric film. The dielectric film may include silicon.

In some implementations, the second layer includes multiple layers of wiring and dielectric film.

In some implementations, the second circuit element includes a parallel plate capacitor, a crossover wiring, an amplifier, a resonator, wiring comprising multiple layers of superconductor material, or a Josephson logic circuit.

In some implementations, the single layer of superconductor material includes a measurement readout resonator operably coupled to a qubit of the first chip through the bump bond.

In some implementations, the substrate includes single crystal silicon.

In some implementations, the substrate has a thickness between approximately 100 microns and approximately 1000 microns.

In some implementations, the through connector includes tungsten or copper.

In some implementations, the through connector includes a superconductor.

In some implementations, a thickness of the bump bond between the single layer of superconductor material and the first chip may be between approximately 1 micron to approximately 10 microns.

In some implementations, the single layer of superconductor material includes aluminum or niobium.

In general, in another aspect, the subject matter of the present disclosure can be embodied in methods that include: providing a first chip including a qubit; providing a second chip including a substrate, a single layer of superconductor material forming a first circuit element on a first side of the substrate, and a second circuit element on a second side of the substrate opposite to the first side, the second circuit element being coupled (e.g., electrically coupled) to a portion of the single layer of superconductor material; and joining the first chip to the second chip such that the layer of superconductor material of the second chip faces the first chip.

Implementations of the methods can include one or more of the following features, or other features described herein. For example, in some implementations, joining the first chip to the second chip includes forming a bump bond between the first chip and the second chip.

In some implementations, the bump bond is configured to couple data between the qubit and the first circuit element.

In general, in another aspect, the subject matter of the disclosure can be embodied in devices that include: a first chip including a quantum circuit element; and a second chip bonded to the first chip, the second chip including a substrate including a single first superconductor layer on a first side of the substrate, the single first superconductor layer joined to the first chip, and a second superconductor layer on a second different side of the substrate.

Implementations of the devices may include one or more of the following features or other features described herein. For example, in some implementations, the second chip further includes a connector that extends from the first side of the substrate to the second side of the substrate and connects a portion of the single first superconductor layer to the second superconductor layer.

In some implementations, the single first superconductor layer is in direct contact with the first side of the substrate. A gap may extend between a top surface of the single first superconductor layer and the first chip.

In some implementations, the second chip further includes a dielectric layer on the second different side of the substrate.

Various embodiments and implementations can include one or more of the following advantages. For example, in some implementations, the devices and method allow a reduction in energy loss and dissipation in quantum circuit elements caused by deposited dielectric materials.

For the purposes of this disclosure, a superconductor (alternatively, superconducting) material may be understood as a material that exhibits superconducting properties at or below a superconducting critical temperature. Examples of superconductor material include aluminum (superconducting critical temperature of, e.g., 1.2 kelvin), niobium (superconducting critical temperature of, e.g., 9.3 kelvin) and titanium nitride (superconducting critical temperature of, e.g., 5.6 kelvin).

The details of one or more implementations of the invention are set forth in the accompanying drawings and the description below. Other features and advantages will be apparent from the description, the drawings, and the claims.

DETAILED DESCRIPTION

Figure 1:
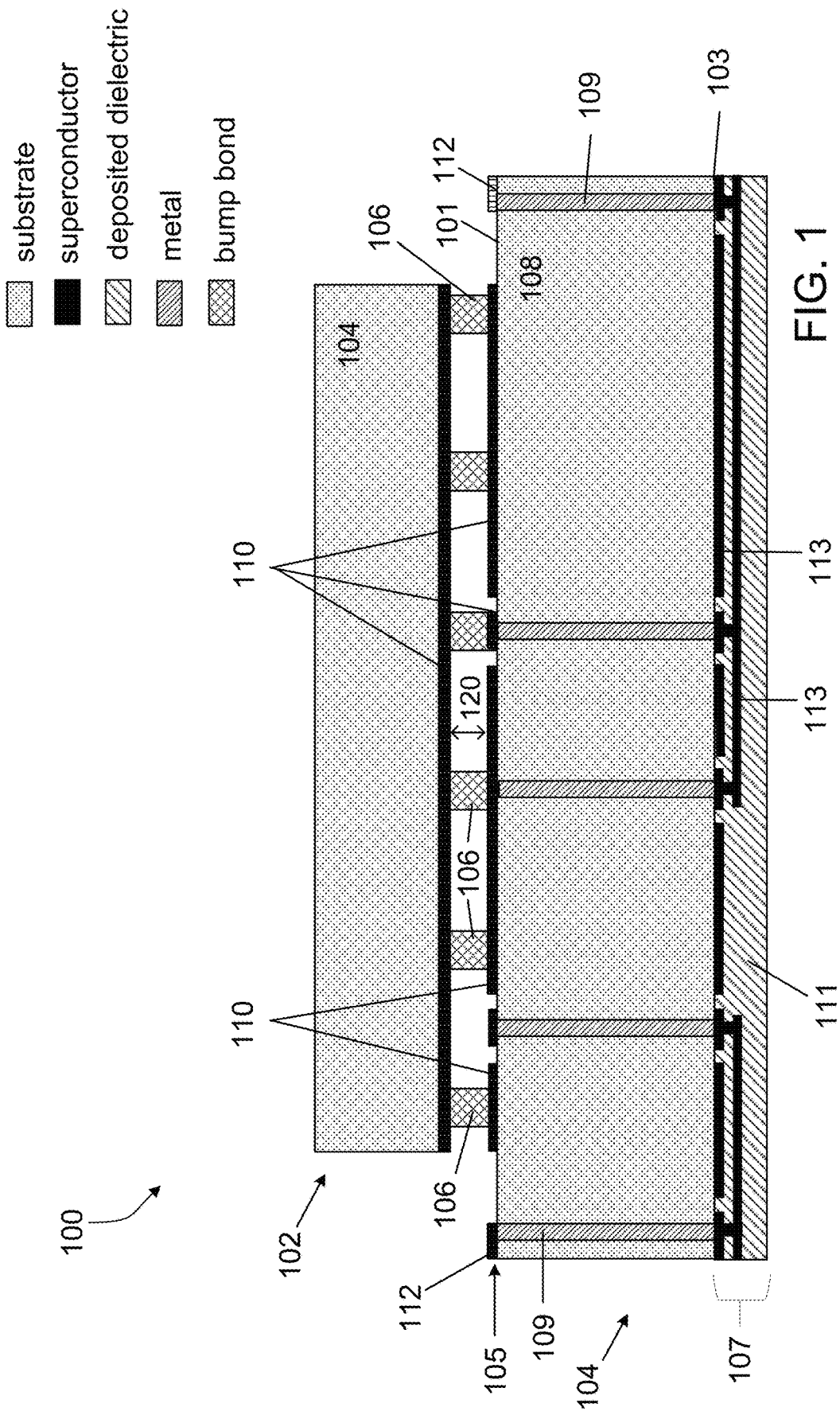
FIG. 1 is a schematic that illustrates an example of a device for reducing energy loss/dissipation in quantum processors.

Quantum computing entails coherently processing quantum information stored in the quantum bits (qubits) of a quantum computer. In certain types of quantum computing processors, such as quantum annealers, the qubits of the quantum processor are coupled together in a controllable manner such that the quantum state of each qubit affects the corresponding quantum states of the other qubits to which it is coupled. Superconducting quantum computing is a promising implementation of quantum computing technology in which quantum circuit elements are formed, in part, from superconductor materials. Superconducting quantum computers are typically multilevel systems, in which only the first two levels are used as the computational basis. Such quantum computers are to be operated at very low temperatures so that superconductivity can be achieved and so that thermal fluctuations do not cause transitions between energy levels. Additionally, it may be preferable that the quantum circuit elements are operated with low energy loss/dissipation to avoid quantum decoherence.

Superconducting quantum circuit elements (also referred to as quantum circuit devices), such as qubits, inductance based photon detectors, and resonators, among others, rely on low loss reactive microwave components to achieve a high quality factor, Q. In some implementations, fabrication of complex quantum circuit structures (or classical circuit structures) may require using one or more layers of deposited dielectrics in addition to the superconductor material. However, deposited dielectrics, which may be amorphous or polycrystalline solids, typically have high loss compared to non-deposited dielectrics, such as single crystal silicon substrates (in some cases by many orders of magnitude). Such deposited dielectrics may not be suitable for high coherence/low decoherence superconducting quantum circuits. These so-called "lossy" deposited dielectrics may dominate dissipation in the system causing, e.g., qubit decoherence through field coupling, and thus limiting the performance of the quantum processor.

Accordingly, in some implementations, it may be useful to arrange complex circuit elements that have one or more layers of lossy dielectrics, relatively far away from the qubits, such as on a separate chip from the qubits. The chip (or chips) containing the qubits then may be stacked on the chip containing the complex quantum and/or classical circuit elements. However, even when the circuit elements having lossy dielectrics are arranged on a separate carrier chip, the circuit elements may lead to decoherence if they are too close to the qubits. For example, circuit elements having lossy dielectrics may be arranged on a surface of the carrier chip that faces the chip including the qubits, such that the distance between the circuit elements and the qubit carrying chip is limited to the thickness of the bond connections between the two chips. In some implementations, this can lead to lossy interactions between the circuit elements and the qubits, causing the qubits to decohere.

The present disclosure relates to reducing such loss in stacked quantum devices by arranging circuit elements having lossy dielectrics on a surface of the carrier chip facing away from chip containing the qubits (the "non-coherent side"). For instance, the circuit elements that would otherwise induce decoherence in nearby qubits may be placed on a reverse or backside of the carrier chip. Circuit elements that maintain high coherence and low loss may be arranged on the front side (the "coherent side") of the carrier wafer closer to the qubits of the qubit carrying chip. For example, circuits that maintain high coherence and low loss may be arranged within a single layer that is formed in direct contact with a surface of the carrier wafer.

FIG. 1 is a schematic that illustrates an example of a device 100 for reducing energy loss/dissipation in quantum processors. The device 100 includes a first chip 102 including quantum circuit elements, such as qubits, joined (e.g., bonded) to a second chip 104, also referred to as a carrier chip, including circuit elements for processing data obtained from the first chip 102 and/or for sending data to the first chip 102. The second chip 104 includes a substrate 108 having first 101 and second 103 opposing surfaces, with the first surface 101 facing the first chip 102. The second chip 104 includes a first layer 105 formed on the first surface 101, in which the first layer 105 includes components and/or materials formed from a layer of superconducting metal that is in direct contact with the underlying substrate 108. In implementations in which the substrate 108 is a crystalline dielectric, this provides a system that has low loss and high coherence, and is less likely to cause quantum circuit elements, such as qubits, on the first chip 102 to decohere. The second chip 104 also includes a second layer 107 formed on the second surface 103, in which the second layer 107 includes components and/or materials that can cause relatively higher loss in quantum circuit elements than the materials/components of the first layer 105. The first layer 105 and the second layer 107 are coupled (e.g., electrically connected) by a connector 109 that extends from the first surface 101 to the second surface 103 of the substrate 108.

As explained herein, each of the first chip 102 and the second chip 104 includes one or more circuit elements for performing data processing operations. For example, in some implementations, the first chip 102 includes one or more quantum circuit elements for use in performing quantum processing operations. That is, the quantum circuit elements may be configured to make use of quantum-mechanical phenomena, such as superposition and entanglement, to perform operations on data in a non-deterministic manner. In contrast, classical circuit elements generally process data in a deterministic manner. In some implementations, the first chip 102 includes only quantum circuit elements, e.g., the first chip 102 does not include classical circuit elements.

Certain quantum circuit elements, such as qubits, may be configured to represent and operate on information in more than one state simultaneously. In some implementations, quantum circuit elements include circuit elements such as superconducting co-planar waveguides, quantum LC oscillators, flux qubits, charge qubits, superconducting quantum interference devices (SQUIDs) (e.g., RF-SQUID or DC-SQUID), among others. The quantum circuit elements may include circuit elements formed, in part, from superconductor materials (e.g., aluminum, titanium nitride or niobium).

The quantum circuit elements of the first chip 102 may be formed on and/or within a substrate. The substrate of the first chip may be formed from, e.g., a low loss dielectric suitable for quantum circuit elements, such as a silicon or sapphire wafer. Other materials may be used for the substrate instead.

The second chip 104, also referred to as a carrier chip, may include multiple quantum circuit elements as well. For example, quantum circuit elements formed on the second chip 104 may include superconductor co-planar waveguides, resonators, capacitors, transmission lines, ground planes, amplifiers, RF or DC superconducting quantum interference devices (SQUIDs), Josephson junctions, among other types of quantum circuit elements In some implementations, the quantum circuit elements on the first and/or second chips 102, 104 may be arranged to form special purpose circuits, such as readout devices for the qubits or control devices for the qubits. For example, the coherent of the second chip 104 may include a co-planar waveguide transmission line, a resonator and/or a single layer SQUID made from double angle evaporation. The non-coherent side may include, for example, microstrip transmission lines, complex multi-layer amplifier circuits, parallel plate capacitors, multi-layer wiring, and/or Josephson logic elements.

In some implementations, the second chip 104 may include classical circuit elements. The classical circuit elements also may be formed, in part, with superconductor materials to maintain uniform processing methods. Examples of classical circuit elements formed with superconductor materials include rapid single flux quantum (RSFQ) devices. RSFQ is a digital electronics technology that uses superconductor devices, namely Josephson junctions, to process digital signals. In RSFQ logic, information is stored in the form of magnetic flux quanta and transferred in the form of Single Flux Quantum (SFQ) voltage pulses. Josephson junctions are the active elements for RSFQ electronics, just as transistors are the active elements for semiconductor CMOS electronics. RSFQ is one family of superconductor or SFQ logic. Others include, e.g., Reciprocal Quantum Logic (RQL) and ERSFQ, which is an energy-efficient version of RSFQ that does not use bias resistors. Other examples of classical circuits include digital or analog CMOS devices. The classical circuit elements may be configured to collectively carry out instructions of a computer program by performing basic arithmetical, logical, and/or input/output operations on data, in which the data is represented in analog or digital form. In some implementations, the classical circuit elements on the second chip 104 may be used to transmit data to and/or receive data from the quantum circuit elements on the second chip 104 and/or the first chip 102 through electrical or electromagnetic connections.

Similar to the first chip 102, the second chip 104 also may include a substrate 108 formed from a low loss dielectric material suitable for quantum circuits, such as single crystalline silicon or sapphire. The thickness of the substrate 108 may be between, e.g., approximately 100 microns and approximately 1000 microns.

The first chip 102 may be joined to the second chip 104 through bump bonds 106. The bump bonds 106 may be arranged to couple data between qubits on the first chip 102 and the circuit elements on the second chip 104. The bump bonds 106 may include superconductor material to avoid energy loss and decoherence of qubits that may be located, e.g., on the first chip 102. For instance, suitable superconductor material for use as a bump bond 106 includes, but is not limited to, indium, lead, rhenium, palladium, or niobium having a thin layer of gold. The bump bonds 106 may be formed on interconnect pads 110 on both the first chip 102 and the second chip 104. In some implementations, to avoid diffusion between the bump bonds 106 and the interconnect pads 110, the bump bonds 106 include a barrier layer that serves as an electrically conducting barrier to block diffusion of bump bond material into the interconnect pad 110 and/or vice-versa. An example barrier layer material includes titanium nitride.

The thickness of the bump bonds 106 may be set so that the first chip 102 and the second chip 104 are spaced to achieve a desired capacitive or inductive coupling between circuit elements on the first chip 102 and on the second chip 104. For example, a distance 120 between a surface of the interconnect pads 110 on the first chip 102 and the interconnect pads 110 on the second chip 104 may be set to be between approximately 0.5 µm and approximately 100 µm (e.g., between approximately 10 µm and approximately 20 µm, between approximately 1 µm and 10 µm, between approximately 0.5 µm and approximately 20 µm, between approximately 0.5 µm and approximately 15 µm, between approximately 0.5 µm and approximately 10 µm, between approximately 0.5 µm and approximately 5 µm, or between approximately 0.5 µm and approximately 2.5 µm). The approximate distance may be within an uncertainty based on the accuracy and/or precision limitations of the deposition technique(s) used to deposit and/or remove material to form the bump bonds 106 (and/or other components that may affect the distance) as well as of the metrology technique(s) with which the distance is measured.

The interconnect pad 110 provides an electrical connection to a circuit element on the chip on which the pad 110 is formed. For example, the interconnect pads 110 of the first chip 102 are coupled (e.g., electrically or electromagnetically) to one or more circuit elements of the first chip 102. Similarly, the interconnect pads 110 of the second chip 104 are coupled (e.g., electrically or electromagnetically) to one or more circuit elements of the second chip 104. The coupling of the interconnect pads 110 to circuit elements may be provided by interconnects formed on and/or within the substrate of each chip. For instance, interconnect pads 110 of second chip 104 may be coupled to circuit elements through a single layer of metallization/superconductor material on the front-side surface of the substrate 108 (e.g., co-planar with the circuit elements). Alternatively, or in addition, the interconnect pads 110 of second chip 104 may be coupled to circuit elements on the backside surface 103 of substrate 108 using through-substrate contacts 109. The interconnect pads 110 may be formed of a superconductor material to reduce decoherence and energy loss in adjacent quantum circuit elements and/or to reduce heat generated from the chip. For instance, the interconnect pads 110 may be formed from aluminum, niobium or titanium nitride. Other materials may be used for the interconnect pads 110 as well.

In some implementations, the second chip 104 also may include wire-bond pads 112. The wire-bond pads 112 provide an area to which a wire-bond may be formed for electrically connecting the chip 104 to an external device, such as external electronic control and measurement devices. In some implementations, the wire-bond pads 112 are formed from the same material as the interconnect pads 110. For example, the wire-bond pads may be formed from aluminum, niobium, or titanium nitride. Other materials also may be used for the wire-bond pads 112.

As explained herein, the first layer 105 of second chip 104 includes components and/or materials that cause relatively low loss and decoherence in nearby quantum circuit elements, such as qubits, on the first chip 102. For example, in some implementations, the first layer 105 includes a layer of superconductor material that is deposited on the low loss substrate 108. The superconductor material of layer 105 may be patterned to form specific circuit elements, such as resonators, transmission lines, wire bond pads and interconnect pads 110. In some implementations, the layer 105 may be formed directly in contact with the surface 101 of substrate 108. In some implementations, the layer 105 does not include any dielectric material, such as deposited dielectrics. An advantage of forming layer without dielectric material is that it reduces the loss such material can cause in nearby quantum circuit elements, such as qubits. In some implementations, the layer 105 includes a single layer of superconductor material, such that the circuit elements of layer 105 are formed solely from the superconductor material. The superconductor material selected for layer 105 may include, e.g., aluminum, though other superconductor material may be used instead.

Figure 2:
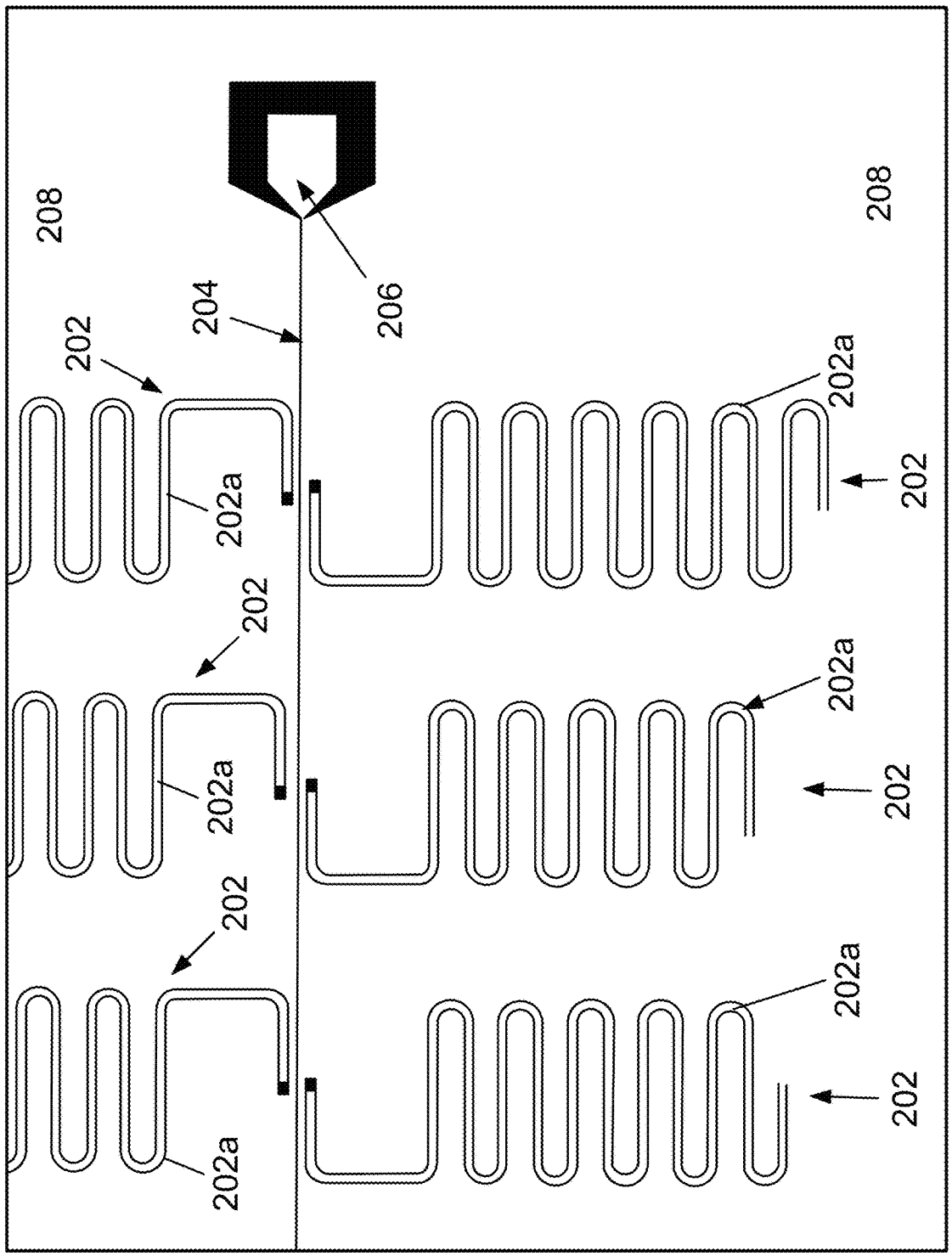
FIG. 2 is a schematic illustrating a top view of an example of a layer on a carrier chip.

FIG. 2 is a schematic illustrating a top view of an example of layer 105 from carrier chip 104. The layer 105 includes multiple co-planar circuit elements. For example, layer 105 may include one or more co-planar waveguide resonators 202. The co-planar waveguide resonators 202 include a center line 202a, which is separated from a ground plane 208 on either side by a constant width gap (denoted by the black lines surrounding center lines 202a in FIG. 2). In some implementations, the layer 105 includes one or more transmission lines 204. The transmission lines 204 may be configured and arranged near one or more of the co-planar waveguide resonators 202 so that the transmission lines 204 can electromagnetically couple to the resonators 202 during operation of the carrier chip. Layer 105 may further include interconnect pads arranged to make contact with the bump bonds between the first chip 102 and the second chip 104. Alternatively, or in addition, the interconnect pads may be electrically coupled to through-contacts arranged on or within the second chip. Layer 105 may further include wire-bond pads 206. Each of the interconnect pads and the wire-bond pads 206 may be fabricated by etching away predetermined portions of the superconductor material on the substrate surface 101 to form defined superconductor regions. Wire-bond pads 206 may be electrically connected to the transmission lines 204.

As explained herein, and referring again to FIG. 1, the second chip 104 also includes second layer 107 formed on the second surface 103 of substrate 108, in which the second layer 107 includes components and/or materials that can cause relatively higher loss in quantum circuit elements (e.g., qubits) than the materials/components of the first layer 105. By arranging such circuit elements on the bottom side of the substrate 108, those circuit elements are further away from the quantum circuit elements of the first chip 102 as well as from the quantum circuit elements of layer 105. Therefore, the circuits formed within layer 107 are less likely to induce energy loss or decoherence in the quantum circuit elements of chip 102 or of layer 105.

Layer 107 may include one or more layers of material. For example, layer 107 may include one or more layers of a deposited dielectric 111, such as $SiO_2$, SiN, or amorphous Si. Layer 107 may also include one or more layers of superconductor material 113, such as aluminum. Alternatively or in addition, layer 107 may include materials that do not function as superconductors, such as copper or silver. The materials of layer 107 may be patterned into one or more quantum or classical circuit elements. Examples of quantum or classical circuit elements that may be formed in layer 107 include a resistor, an inductor, a capacitor (e.g., a parallel plate capacitor), a crossover wiring (e.g., an air-bridge connector), an amplifier (e.g., a traveling wave parametric amplifier), a resonator (e.g., an LC oscillator), or a Josephson logic circuit (e.g., an RSFQ device, and RQL device, or an ERSFQ device).

Figure 3:
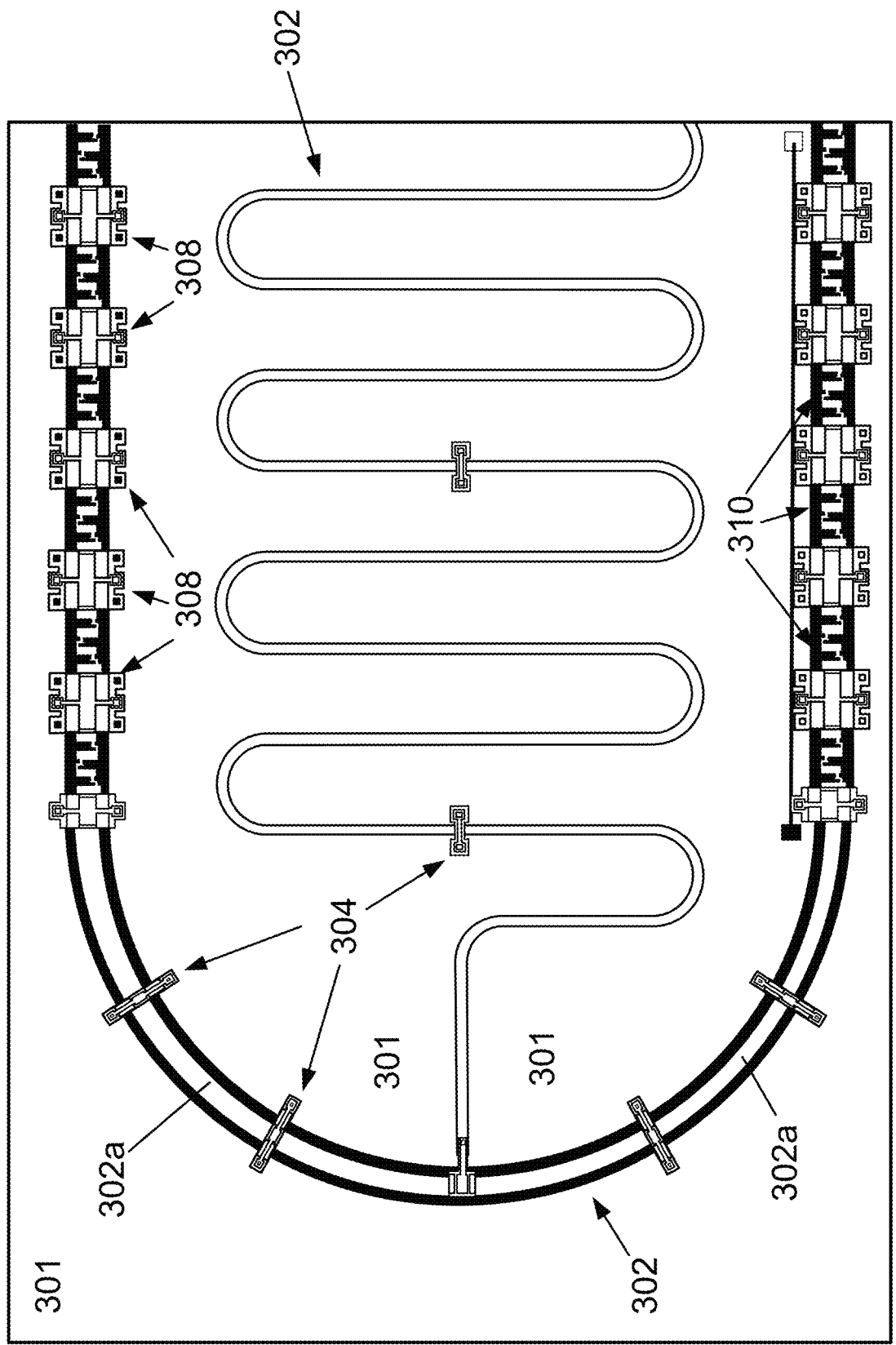
FIG. 3 is a schematic illustrating a top view of an example of a layer on a carrier chip.

FIG. 3 is a schematic illustrating a top view of an example of layer 107. As shown in the example of FIG. 3, layer 107 includes multiple circuit elements. For instance, layer 107 in the example includes a co-planar transmission line 302. The transmission line 302 includes a center line 302a formed from a superconductor material and may be separated from a ground plane 301. Layer 107 also includes dielectric crossovers 304 that provide a common electrical connection between the ground planes on either side of the center line 302a without electrically connecting to the center line 302a. Layer 307 also includes a co-planar waveguide resonator 306, parallel plate capacitors 308, and hybrid junction transmission lines 310. Fabrication of the parallel plate capacitors 308 and transmission lines 310 may include, e.g., deposition of a first layer of aluminum, followed by deposition of a dielectric layer, and then deposition of a second aluminum layer. In some implementations, a via opening may be established within the dielectric layer so that the second aluminum layer is deposited within the via and makes contact with the first aluminum layer after deposition. Multiple patterning (e.g., lithography and etching) steps may be required to define the different aluminum and dielectric layers.

Referring again to FIG. 1, and as explained herein, first layer 105 and second layer 107 are coupled (e.g., electrically connected) by one or more connectors 109 that extend from the first surface 101 to the second surface 103 of the substrate 108 of carrier chip 104. In some implementations, a connector 109 includes material that allows a low resistance electrical connection to be made be between one or more circuit elements of the first layer 105 and one or more circuit elements of the second layer 107. For example, in some implementations, the second layer 107 includes an amplifier that coupled to a measurement readout resonator through the connector 109. Accordingly, in some implementations, a signal used to probe the resonator may be routed from layer 105 through connector 109 to the amplifier of layer 107. Examples of material that can be used as the connector 109 include superconductor material such as aluminum or niobium. In some implementations, the connector 109 includes a material that is not a superconductor, but that still provides relatively low resistance, such as copper, tungsten or gold. The connectors 109 are located in a hole or via formed within the substrate 108. The hole or via in the substrate may be formed using, e.g., reactive ion etching or other suitable technique that allows a relatively constant area opening to be formed through the thickness of the substrate 108. Once the hole or via is formed, the hole or via may be filled to form the through-hole connector 109. For instance, atomic layer deposition may be used to deposit tungsten or copper within the hole. Alternatively, or in addition, electroplating techniques may be used.

Although the connectors 109 are shown in FIG. 1 as extending through an opening in substrate 108, the connectors 109 alternatively (or additionally) may be formed so that they extend along an outer edge of the substrate 108, such that it is not necessary to form a hole within substrate 108.

Implementations of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements may be used to perform quantum processing operations. That is, the quantum circuit elements may be configured to make use of quantum-mechanical phenomena, such as superposition and entanglement, to perform operations on data in a non-deterministic manner. Certain quantum circuit elements, such as qubits, may be configured to represent and operate on information in more than one state simultaneously. Examples of superconducting quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Other implementations are within the scope of the following claims.

What is claimed is:

1. A method comprising:
   providing a first chip comprising a qubit;
   providing a second chip, the second chip comprising
   a substrate,
   a single layer of superconductor material forming a first circuit element on a first side of the substrate,
   a plurality of layers on a second side of the substrate that is opposite to the first side of the substrate, wherein the plurality of layers comprise a first dielectric layer and a superconductor layer, and wherein the plurality of layers form, in part, a second circuit element, and a connector that extends from the first side of the substrate to the second side of the substrate and electrically connects the first circuit element to the second circuit element the second circuit element, wherein there is no deposited dielectric material in direct contact with the first side of the substrate or in direct contact with a surface of the single layer of superconductor material that faces the first chip, wherein the first circuit element comprises a measurement readout resonator operably coupled to the qubit of the first chip, and the second circuit element is an amplifier; and joining the first chip to the second chip such that the layer of superconductor material of the second chip faces the first chip.

2. The method of claim 1, wherein joining the first chip to the second chip comprises forming a bump bond between the first chip and the second chip.

3. The method of claim 2, wherein the bump bond is configured to couple data between the qubit and the first circuit element.

4. The method of claim 1, wherein the first dielectric layer is silicon.

5. The method of claim 1, wherein the single layer of superconductor material comprises a wire bond pad in addition to the first circuit element.

6. The method of claim 5, wherein the single layer of superconductor material comprises a transmission line in addition to the first circuit element and the wire bond pad, the wire bond pad being electrically connected to the transmission line and the transmission line being arranged to electromagnetically couple or electrically couple to the first circuit element.

7. The method of claim 1, wherein the connector extends through an opening in the substrate.

8. The method of claim 1, wherein the plurality of layers on the second side of the substrate comprises multiple layers of wiring and dielectric film.

9. The method of claim 1, wherein the plurality of layers on the second side of the substrate further comprises at least one of a parallel plate capacitor, a crossover wiring, a resonator, wiring comprising multiple layers of superconductor material, and a Josephson logic circuit.

10. The method of claim 1, wherein the substrate comprises single crystalline silicon.

11. The method of claim 1, wherein the connector comprises tungsten or copper.

12. The method of claim 1, wherein joining the first chip to the second chip comprises forming a bump bond between the first chip and the second chip, and wherein a thickness of the bump bond is set so that the first chip and the second chip are spaced apart to achieve a predetermined electromagnetic coupling between the first circuit element and the qubit.

* * * * *